United States Patent [19]

Dean et al.

[11] Patent Number: 5,321,290
[45] Date of Patent: Jun. 14, 1994

[54] THERMAL IMAGING DEVICES

[75] Inventors: Anthony B. Dean; Peter N. J. Dennis; Charles T. Elliott, both of Hereford and Worcester, England

[73] Assignee: The Secretary of State for Defence in Her Britannic Majesty's Government of Great Britain and Northern Ireland, London, England

[21] Appl. No.: 178,556

[22] Filed: Jul. 29, 1980

[30] Foreign Application Priority Data

Jul. 30, 1979 [GB] United Kingdom ............... 7926455

[51] Int. Cl.$^5$ .................. H01L 25/00; G02C 26/10; G01T 1/22
[52] U.S. Cl. .................. 250/332; 250/334; 250/338.4; 250/370.08; 257/215; 257/431
[58] Field of Search .................. 250/332, 334, 338.4; 250/370.08; 357/30, 24 LR

[56] References Cited

U.S. PATENT DOCUMENTS 3,983,573 9/1976 Ishihara .................. 357/24
4,032,903 6/1977 Weimer .................. 357/24

FOREIGN PATENT DOCUMENTS 1488258 10/1977 United Kingdom .

OTHER PUBLICATIONS

Husain-Abidi et al, Proc. Soc. Photo-Opt. Instrum, England, 1980, pp. 10; 250–332.
Int. Conf on the Appl. of CCD's, 1975, pp. 53–58.

Primary Examiner—Stephen C. Buczinski
Attorney, Agent, or Firm—Cushman, Darby & Cushman

[57] ABSTRACT

A thermal imaging device having both serial and parallel content is provided by a number of infra-red radiation detector strips supported side by side on an insulating substrate, each strip having a number of read-out regions. To allow connection from the side of the device to the innermost detector strips, conductors err end across outer strips. These conductors may extend over the strips and over insulating material therebetween. Alternatively the conductors may be in the form of conductive tracks embodied in a substrate of semiconductor material. The strips may be indented at the read-out regions to provide, with very close spacing, sufficient room for contact between the read-out regions and the conductive tracks. Preformed aluminium contact pads may be used between bridging links to the read-out regions and the conductive tracks the contact pads and preformed tracks being centered during preformation to ensure a good ohmic contact.

12 Claims, 5 Drawing Sheets

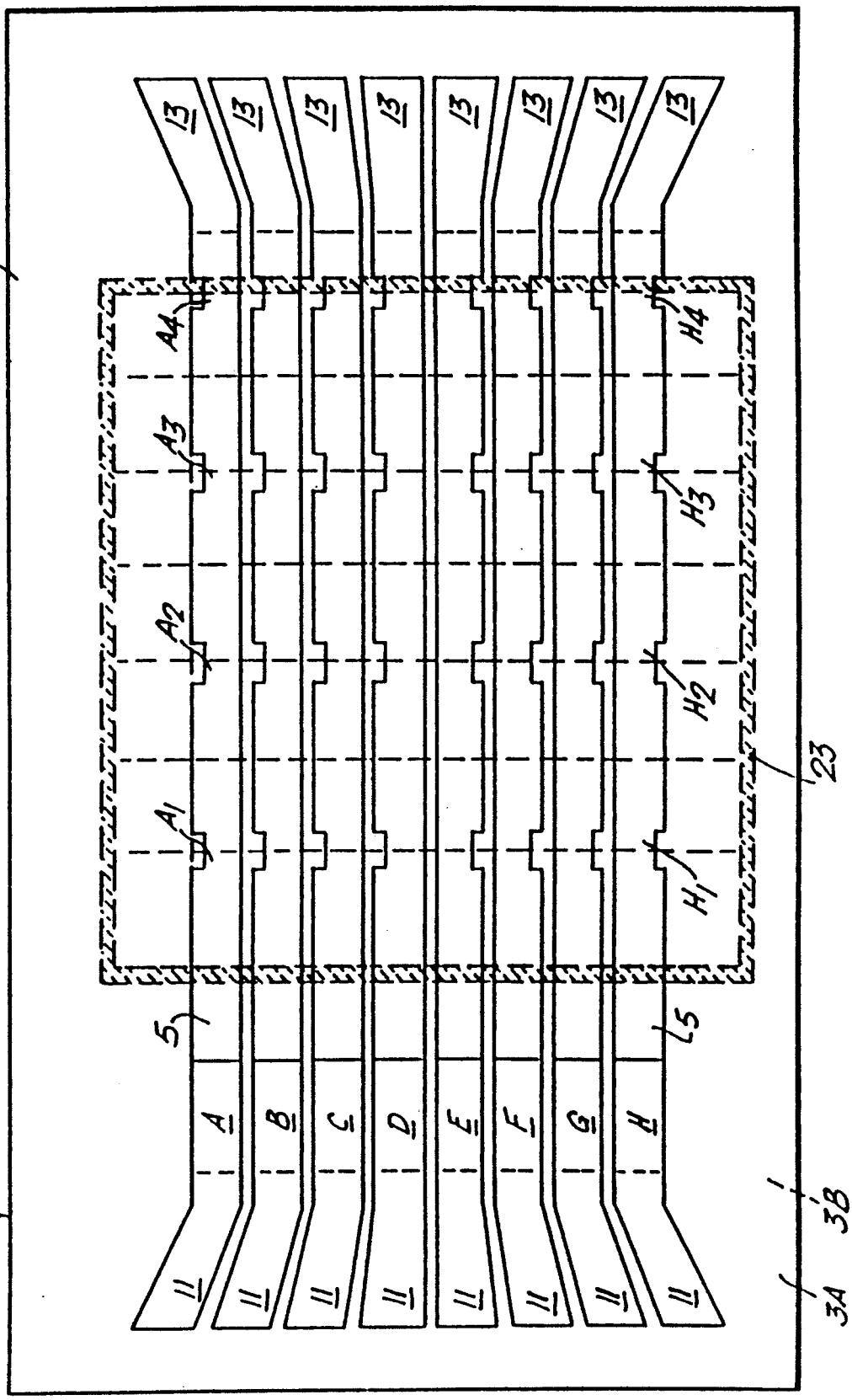

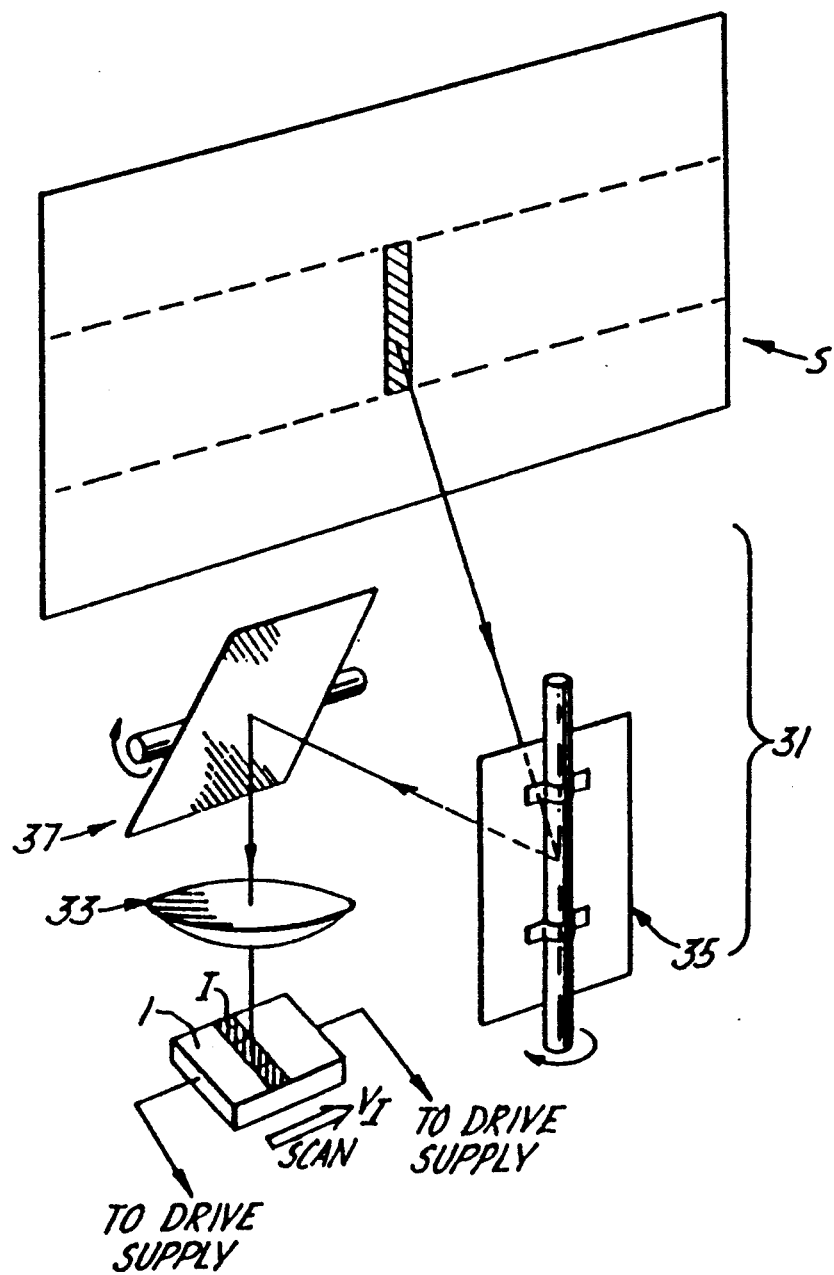

THERMAL IMAGING DEVICES

The present invention concerns thermal imaging devices. Particularly, but not exclusively, it concerns imaging devices including a plurality of infra-red radiation detectors arranged to facilitate both serial and parallel scan coverage of a thermal scene.

One conventional type of serial imaging device comprises a row of discrete detector elements mounted on an insulating substrate. Each detector element is connected to external signal processing circuitry, which latter provides signal amplification and time delay integration of the response signals provided by these individual detector elements. It is however a disadvantage of this type of device that a large number of circuit components are required, a set of components being utilised by each element. Also, where for optimum performance the device is operated at low temperature, the relatively large number of connecting leads required introduces an additional means of heat transfer and gives rise to appreciable demand on the size and weight of effective cooling accessories.

An alternative type of serial imaging device, which for comparable performance requires fewer processing components and fewer connecting leads, is described in UK Patent Serial No. 1,488,258, This alternative type of device comprises a detector including a strip of photo-conductive material mounted on an insulating substrate. The strip has bias contacts at either end and a single read-out region adjacent to one of these contacts. When this device is encorporated in an imaging system including, in addition to the device, a drive supply and focussing/scanning optics, the device is operated so that photo-carriers are generated upon exposure of the device to a scanned infra-red radiation image, the photo-carriers are caused to drift along the strip towards the read-out region at a velocity that is matched to the velocity of the scanned image. This operation permits signal integration to be performed within the detector itself. However, the finite lifetime of the photo-carriers sets a practical limit upon the detector size.

Also, serial imaging devices have been described which encorporate signal processing circuitry. See, for example. Proceedings Sandiego Conference on Charge-Coupled Devices 1975 pp 52–58. As there described a device of hybrid structure is provided by a row of detector elements of cadmium mercury telluride material, each detector feeding an input of a charge coupled device register via matching FET semiconductor components encorporated in a supporting semiconductor substrate. There are however problems in connecting and matching the many elements to the register to give satisfactory performance.

Where detected signals are required to provide video display, serial imaging devices generally need to be scanned at high rates and consequently systems encorporating these devices demand substantial power for driving the scan mechanism. Parallel imaging devices are also known comprising a column of discrete detector elements. For these devices the thermal image is scanned band by band i.e. several lines each scan, rather than line by line, thus allowing a reduction in the scanning rate and the power demand. Parallel detector devices are however inferior in terms of signal to noise performance. The advantages of both serial and parallel device imaging have been afforded in 2-dimensional array devices. Typically, such a 2-D array device comprises a multiplicity of discrete detector elements arranged in rows and columns. However, where signal processing is performed externally, the large number of leads required similarly present cooling problems. Also where, alternatively, these elements are connected to Substrate components, the relatively large number of individual element connections can lead to problems of matching, device reliability, and manufacturing yield.

According to the present invention there is provided a thermal imaging device comprising:

plurality of infra-red radiation detector strips, supported side by side in close proximity on an insulating substrate, each detector strip comprising a strip of photo-conductive material having an input and an output bias contact, and between these contacts a plurality of read-out regions spaced along the strip;

connection to at least one of the read-out regions being provided by at least one conductor extending across each strip adjacent one side thereof.

In this device each length of the strip between neighbouring read-out regions can provide internal signal integration when an infra-red image is scanned in synchrony with photo-carrier drift, in the manner referred to above. The integration is comparable to a summation over several discrete detection elements. By having a plurality of read-out regions, the serial content is increased. Parallel content is increased in proportion to the number of detector strips. When the device is used in a scan system the close spacing of the strips allows optimal use to be made of the focal plane area.

Each read-out region may be defined by a diode and require only a single output connection to facilitate detection of photo-carrier density in a region local to the diode.

Alternatively each read-out region may be defined by a pair of separate contacts spaced apart along the length of the strip.

Connection to the read-out regions of the detector strips may be provided by adjacent electrode overlays, the detector strips being arranged with the read-out regions staggered with respect to each other to allow the electrode overlays to lie side by side. However, it is a disadvantage that the electrode overlays, providing contact to the innermost strip detectors, overlay the outermost detectors, thereby obscuring the radiation image during operation and thus reducing the effective detector area available. Though such a reduction may be tolerable in devices having only a small number e.g. 4 only, of parallel strip detectors, such a reduction becomes less tolerable where greater parallel content is required.

In an alternative device, the insulating substrate is composite and comprises a base layer of semiconductor material having formed on the upper surface thereof a layer of insulating material, wherein connection to the read-out regions is provided by a plurality of doped conductive tracks encorporated in the base layer, which conductive tracks and detection output regions are joined by bridging links of metal forming ohmic connection therebetween, the links passing through windows in the insulating material.

Advantageously, the detector strips may be indented at the read-out regions to provide, with close spacing of the adjacent parallel strips, space for bridging connection. The consequential enhancement of operational bias electric field in the vicinity of the read-out regions, in increasing the signal voltage, also proves to be advantageous.

Preferably the semiconductor material is p-type, the conductive tracks encorporated therein being excessively doped i.e. n+-type. This choice generally favours a lower conductor resistivity than opposite polarity type combinations.

Since the resistance of the conductive tracks inevitably introduces Johnson noise, it is preferable that the conductive tracks are dimensioned to provide a common resistance for each connection. This ensures that noise components may be integrated without undesirable weighting.

Where detectors are mounted upon such a composite insulating substrate, processing circuitry may be embodied in the semiconductor base layer around the periphery of the mounted detectors. Alternatively, and advantageously, processing circuitry may be embodied in the semiconductor base layer beneath the overlying mounted detectors. For each strip, the read-out regions may be interconnected by time delay integration circuitry embodied in the substrate. Each strip then only requires a single connection from the read-out regions to the outside of the device.

Embodiments of the present invention will now be described, by way of example only, with reference to the accompanying drawings of which:

FIG. 3 is a plan drawing of an alternative thermal imaging device incorporating features of the present invention (details of connection configuration being omitted for clarity);

FIG. 7 is an illustration of an imaging system including an imaging device in focal plane position.

Figure 1:
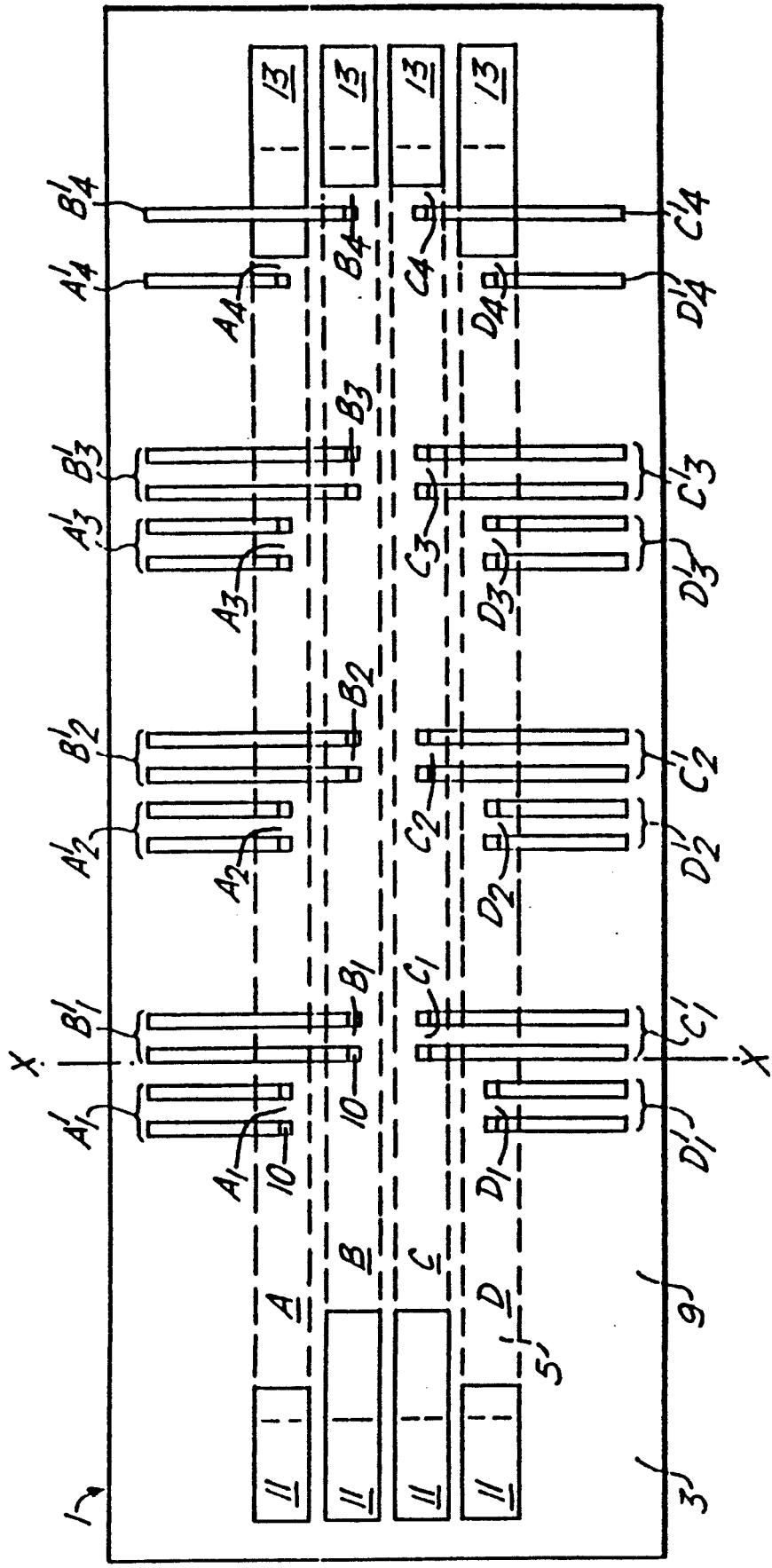
FIG. 1 is a plan drawing of a thermal imaging device incorporating features of the present invention.
Figure 2:
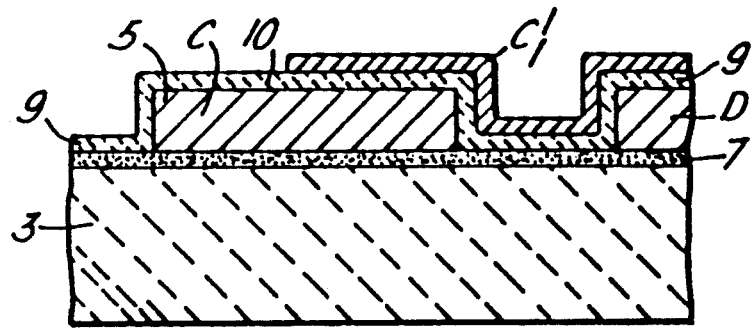
FIG. 2 is a cross-section across part of the imaging device along the line x—x of FIG. 1.
Figure 5:
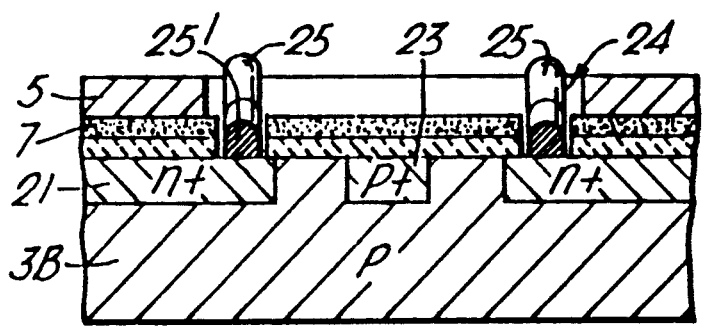
FIGS. 5 & 6 are cross-sections of portions of the device shown in FIGS. 3 and 4 taken along the lines y—y and z—z of FIG. 4 respectively.
Figure 6:
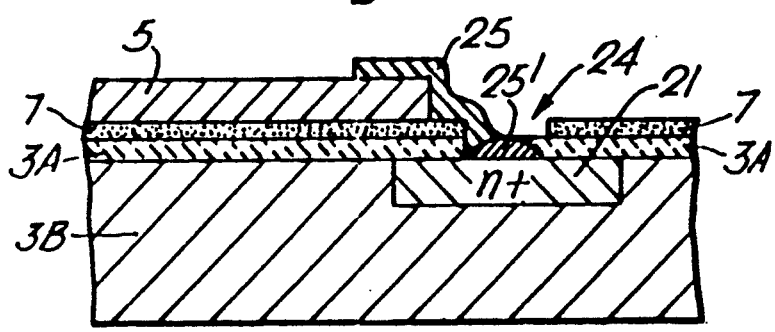
Figure 4:
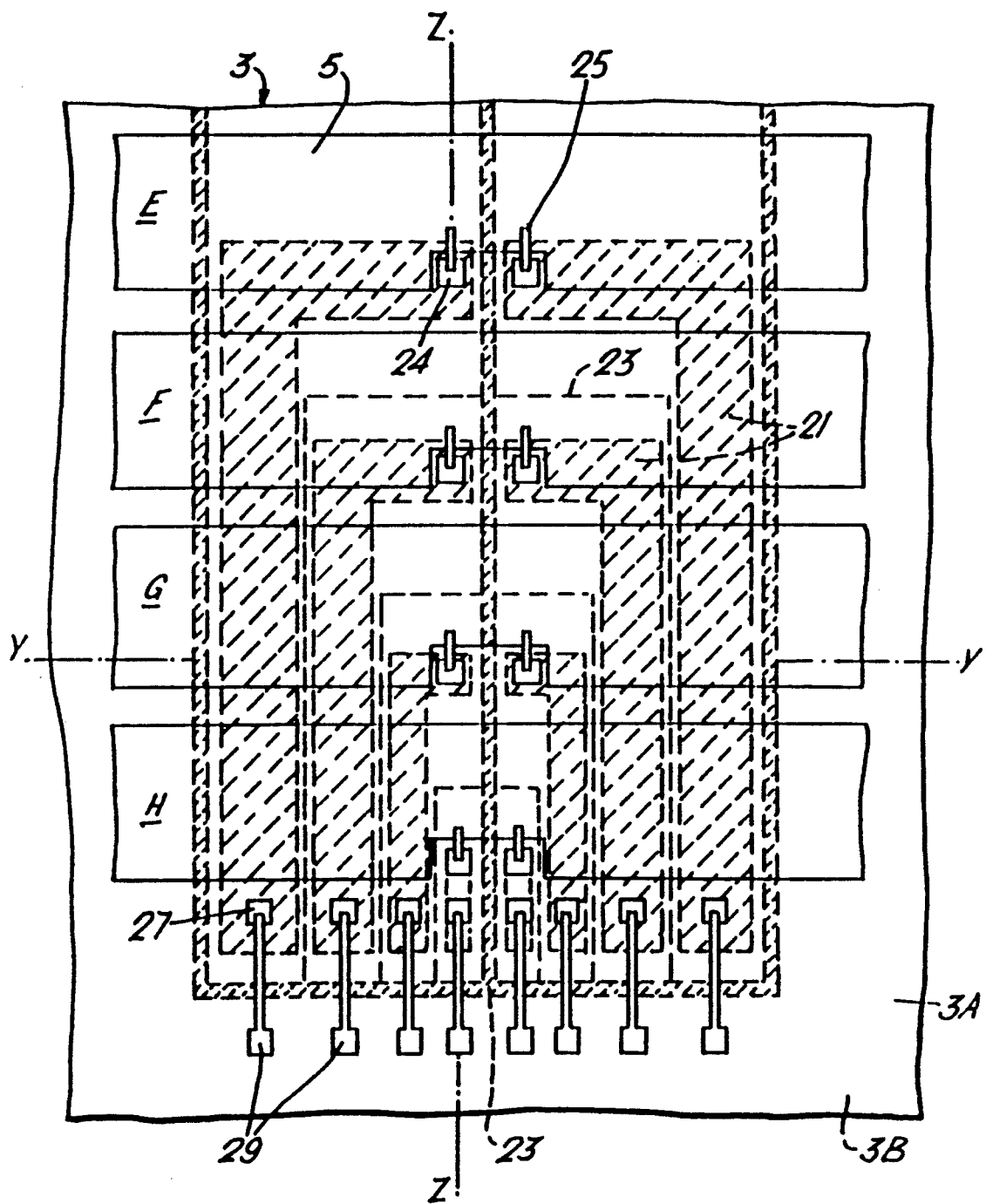
FIG. 4 is an enlarged plan of a portion of the device shown in FIG. 3, showing detail of the connection configuration.

As shown in FIGS. 1 and 2, a thermal imaging device 1 is provided by an aluminium oxide (sapphire) substrate 3 bearing four strip detectors A, B, C and D each comprising a strip 5 of a cadmium mercury telluride (CMT) photoconductive material—e.g. $Cd_{0.2}Hg_{0.8}Te$. This structure is produced by bonding an oversize slice of CMT material onto the insulating substrate with an expoxy resin adhesive, defining the strip pattern photolithographically using a photo-resist medium, and cutting the slice in this pattern using an ion-beam milling technique. (See for example, UK Patent Applications Nos 31749/78, 31750/78 and 31751/78.) When the structure is produced in this manner, the strips may be formed in accurate parallelism and with minimal spacing between each strip. The close spacing of the strips A to D—spaced about 12 $\mu$m apart—makes optimum the proportion of the device area that is available for radiation detection. Input and output bias contacts 11, 13 are provided by sputtering nichrome-gold, these contacts being formed at the end of the CMT strips 5. An anti-reflection coating 9 is deposited on the upper exposed surfaces of the device—for example a thin layer of zinc sulphide material is sputtered onto these surfaces and patterned in conventional manner to leave window regions 10 of the CMT strips exposed to facilitate contact metallisation. Read-out regions $A_1, A_2, \ldots, D_4$ are defined by paired electrical contacts $A_1', A_2', \ldots,$ $D_4'$ also of nichrome-gold material. These read-out regions lie between the bias contacts 11, 13 of each strip and are uniformly spaced. The electrical contacts $A_1'$, $A_2', \ldots, D_4'$ each have a pair separation of about 50 to 60 $\mu$m and each pair is uniformly spaced from its neighbour by about 400 $\mu$m. The pitch of the device is about 75 $\mu$m, with each strip being about 63 $\mu$m wide. The read-out regions of the inner strip detectors B, C have overlying conductor connections that also overlay strips A, D respectively. The positions of read-out regions B1 to 34 and C1 to C4 are staggered relative to regions A1 to A4 and D1 to D4, respectively, allowing the conductor connections $A_1'$ and $B_1'$, $A_2'$ and $B_2'$, . . . , $C_4'$ and $D_4'$ to lie in displaced side by side relationship. The bias contacts 11 are also in displaced relationship, maintaining a common spacing between contacts 11 and the first pair contacts $A_1'$, $B_1'$, $C_1'$ and $D_1'$ of each detector. The second member of each of the terminal contact pairs $A_4'$ to $D_4'$ is provided by each of the bias contacts 13. The bias contacts 13 are therefore also provided in similar displaced relationship to maintain spacing uniformity, i.e. the spacings: $A_1'$ to $A_2', \ldots, A_3'$ to $A_4'$; $B_1'$ to $B_2'. \ldots,$ to $B_3'$ to $B_4'$, etc are all the same.

In operation, the device 1 described above is situated in the focal plane of an optical imaging assembly 31, shown in FIG. 7. This assembly 31 comprises a lens 33, a line scan mirror 35 and a band selection mirror 37. The line scan mirror is rotated and an infrared radiation image I of a thermal scene S is scanned along the device 1 in a direction parallel to each strip detector A to D i.e. in the direction indicated by arrow in FIGS. 1 and 7. In response to the focussed radiation, photocarriers are generated within each strip detector, the local density of these photocarriers depending on local image intensity and the duration of exposure. The device is driven from an external power supply (not shown) and is cooled to liquid nitrogen temperature. Under operative bias conditions, the electric field, developed along each strip detector, causes the photocarriers to drift in the direction from contact 11 to contact 13, at a velocity that matches the velocity $V_I$ of the scanned image I. As the image is scanned along each strip, the photocarriers drift in synchrony, photocarrier density increases as internal time integration takes place, during the transit of the photocarriers from one read-out region to the next. Preferably, to reduce noise correlation, the spacing between adjacent read-out regions is no shorter than the average path length of the photocarriers under operative conditions—i.e. the product of minority carrier average lifetime and ambipolar drift velocity.

A significant proportion of the photocarriers generated in the first length, 11 to $A_1$, of detector A recombine before reaching the second detection region $A_2$ and likewise photocarriers generated in length $A_1$ to $A_2$ recombine before reaching detection region $A_3$, and so on. Thus the strip detector A, provided with a number of coextensive integration lengths 11 to $A_1$, $A_1$ to $A_2$, . . . , $A_3$ to $A_4$, behaves in a manner similar to four discrete (single detection region) strip detectors of the kind described in UK Patent Serial No 1,488,258, but with only two bias contacts.

Each of the pair contacts $A_1'$ to $A_4', \ldots, D_1'$ to $D_4'$ are followed by external amplifiers and the signals for each strip detector added with appropriate time delay to conpensate for the finite time of scan of image points from one detection region to the next. When the image has been scanned along the device, the band selection mirror 37 is advanced, and the line scan mirror 35 re-set causing the image I to flyback and the next adjacent band of the infra-red radiation scene S to be scanned. This process is repeated so that the radiation scene is imaged band by band until the whole scan S is covered.

In the alternative imaging device 1' shown in FIGS. 3 to 6 inclusive, eight strip detectors, A to H, are mounted on a composite insulating substrate 3. Each strip detector is provided with an input bias contact 11 and an output bias contact 13 of nichrome gold material formed at either end. Between these contacts are four read-out regions $A_1$ to $A_4$, ..., $H_1$ to $H_4$ spaced at uniform intervals along each strip of CMT material 5. The detectors are close-spaced and the strips 5 are indented at each read-out region $A_1$, ..., $H_4$ to allow space for contact connection to the underlying substrate 3. The composite substrate 3 comprises a base layer 3B of semiconductor material having on its upper surface a thin layer of insulator material 3A. The semiconductor material may be of intrinsic p-type silicon having a typical majority carrier density of about $5 \times 10^{14}$ per cu cm, and the layer of insulator material. 3A may be silicon oxide, grown by conventional controlled oxidation of the underlying silicon material 3B.

A patterned arrangement of conductive tracks 21 is formed in the semiconductor base 3B. Each track is formed by diffusion or ionimplantation of an n-type dopant material e.g. phosphorus. The doping process is controlled to give an excess n-type carrier concentration of about $1 \times 10^{15}$ per cu cm. Each conductive track 21 is isolated from adjacent tracks by means of a channel stop network 23. This network may be formed in similar manner to the tracks, a p-type dopant material—e.g. boron—being used. The channel stop network 23 has a p-type carrier concentration of about $1 \times 10^{19}$ per cu cm. An insulating oxide layer 3A is formed over the whole of this surface.

In the vicinity of the indented detection output regions $A_1$, ..., $H_4$ insulator material 3A is removed to expose window areas 24 of the conductive tracks 21 formed in the base layer 3B. Bridging links of metallic material 25—e.g. nichrome gold are formed to define and connect the read-out regions to the tracks 21, each link being connected to a different one of the conductive tracks 21. The links 25 are paired and thus provide voltage detection contacts. Insulator material is also removed to expose window areas 27 of the underlying tracks 21 and to allow further connection of these tracks to output connection pads 29. To minimise signal noise, each conductive track is dimensioned to have approximately the same resistance between windows 24 and 27. The longest tracks 21, that extend to the innermost detectors D and E, are therefore also the widest.

It will be understood that amplifier and time-delay-and-integration components may be encorporated in the semiconductor base layer 3B around the periphery of the strips 5 and connection to these components made directly from the tracks 21. Alternatively, in place of the tracks 21, connection may be made directly from the read-out regions $A_1$ to $H_4$ to semiconductor components encorporated in the base layer 3B, these components being arranged in the area underlaying the strips 5.

For better production yield, the contact connections between the detectors 5 and the conductive tracks 21 may be formed in the following manner. Starting with the silicon substrate $3_B$ with oxidised surface $3_A$ and preformed conductive tracks 21, a layer of negative photo-resist is spun on to the surface and window regions defined by exposure and removal of part of the resist. The substrate is then etched to remove windows in the silicon oxide surface layer $3_A$, and the remaining resist removed. Aluminium is evaporated on to the exposed surfaces. A layer of negative photo-resist is then spun on to the surface of the aluminium and a pattern of masking areas of resist formed photo-lithographically over the surface. These mask areas are in register with the original window areas but are smaller in size. The aluminium is then etched leaving aluminium contact pads 25' below the remaining resist, and the resist removed. Since the mask areas are smaller than the original windows, any raised areas of aluminium around the edges of the windows are also etched away. The aluminium contact pads are then lightly etched back until they each lie with their free surface co-planar with or below the planar surface of the oxide layer $3_A$. The substrate is then fired at 450° to 500° C. to ensure that good electrical-contact is made between each aluminium contact pad and the underlying conductive track. A layer of CMT is then bonded on to the substrate surface and the detector geometry defined as described above. Bridging links 25 are then completed by sputtering nichrome gold to provide contact between regions on the detector strips and the preformed aluminium contact pads 25', these pads being exposed during geometry definition.

The technique just described may also be used to provide connection between the read-out regions and any circuitry embodied in the underlying substrate.

Having particularly described the invention and the way it is to be performed claim:

1. An imaging device for use in a thermal image scanner comprising:
   an insulating substrate;
   a plurality of infra-red radiation detectors supported side by side in parallel and in close proximity on the insulating substrate, each detector comprising:
   a discrete strip of photoconductive material for generating photo-carriers in response to incident radiation,
   an input bias contact on the strip adjacent one end of the strip, and an output bias contact on the strip adjacent its other end for connecting the strip to a bias current circuit, and
   a plurality of read-out regions spaced apart along the strip, lying between the input and output bias contacts with at least one output contact on each region for reading out a signal produced by the drifting photo-carriers; and
   a plurality of isolated conductors extending in a direction transverse to each strip with each conductor providing electrical connection to the read-out regions.

2. A device according to claim 1, each contact being defined by a diode.

3. A device according to claim 1, including a pair of separate contacts for each region spaced apart lengthwise.

4. A device according to claim 1, the read-out regions adjacent strips being staggered lengthwise with respect to each other, the conductors comprising electrode overlays arranged side by side across the device.

5. A device according to claim 1, the insulating substrate being a composite comprising: a base layer of semiconductor material, and, a layer of insulating material on the upper surface of the base layer.

6. A device according to claim 5 wherein said conductors are a plurality of doped conductive tracks incorporated in the base layer, which conductive tracks and detection output regions are joined by bridging links of metal forming ohmic connection therebetween, the links passing through windows in the insulating material.

7. A device according to claim 6, the semiconductor material of the base layer being p-type and the conductive tracks therein being n+-type.

8. A device according to claim 1, the conductors having a common value of resistance.

9. A device according to claim 6, tracks of different length having also different widths so that the track resistance is of common value.

10. A device according to claim 1 wherein the detector strips are indented at the read-out regions.

11. A device according to claim 6 wherein connection between the read-out regions and the conductive tracks is provided by preformed metallic contact pads positioned below and adjacent the read-out regions, the upper surface of each pad being co-planar with or lying below the upper surface of the layer of insulating material.

12. A device according to claim 11 wherein the metallic contact pads are of aluminium.

* * * * *